United States Patent
Kwak et al.

(10) Patent No.: US 10,566,381 B2
(45) Date of Patent: Feb. 18, 2020

(54) LIGHT-EMITTING DIODE CHIP AND MICRO DISPLAY DEVICE

(71) Applicant: LG Display Co., Ltd., Seoul (KR)

(72) Inventors: YongSeok Kwak, Gyeonggi-do (KR); Kiyong Yang, Seoul (KR); JinSu Moon, Gyeonggi-do (KR); MyungWon Seo, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/154,949

(22) Filed: Oct. 9, 2018

(65) Prior Publication Data
US 2019/0189679 A1 Jun. 20, 2019

(30) Foreign Application Priority Data
Dec. 14, 2017 (KR) .................. 10-2017-0172248

(51) Int. Cl.
| | |
|---|---|
| H01L 27/15 | (2006.01) |
| H01L 25/18 | (2006.01) |
| H01L 33/50 | (2010.01) |
| H01L 33/00 | (2010.01) |
| H01L 33/44 | (2010.01) |
| G09G 3/3225 | (2016.01) |
| H01L 27/12 | (2006.01) |
| G09G 3/32 | (2016.01) |
| H01L 25/075 | (2006.01) |

(52) U.S. Cl.
CPC .......... *H01L 27/15* (2013.01); *G09G 3/3225* (2013.01); *H01L 25/18* (2013.01); *H01L 33/007* (2013.01); *H01L 33/44* (2013.01); *H01L 33/508* (2013.01); *G09G 3/32* (2013.01); *H01L 25/0753* (2013.01); *H01L 27/1214* (2013.01)

(58) Field of Classification Search
CPC ... G09G 3/3225; H01L 25/0753; H01L 25/18; H01L 27/15; H01L 27/156; H01L 33/44; H01L 33/48; H01L 33/50; H01L 33/508
See application file for complete search history.

(56) References Cited

U.S. PATENT DOCUMENTS 6,914,262 B2 * 7/2005 Hahm ................. H01L 25/0753
257/103
2007/0284994 A1 12/2007 Morimoto et al.
(Continued)

FOREIGN PATENT DOCUMENTS

JP 2007-318050 A 12/2007
JP 2015-173003 A 10/2015
(Continued)

*Primary Examiner* — Allan R Wilson
(74) *Attorney, Agent, or Firm* — Morgan, Lewis & Bockius LLP

(57) ABSTRACT

A light-emitting diode (LED) chip and a display device having the same are provided. A green LED is regrown on a blue LED to produce blue and green light, and a red phosphor is disposed on the blue or green LED to produce red light. Red light, green light, and blue light are to be produced using a single LED chip. The single LED chip forms three subpixels therein so as to facilitate a transfer process of the LED chip to a display panel. The LED chip is configured based on the blue, green, and blue LEDs so as to facilitate the fabrication and driving of the LED chip.

10 Claims, 17 Drawing Sheets

(56) References Cited

U.S. PATENT DOCUMENTS

| | | | |
|---|---|---|---|
| 2010/0123145 A1* | 5/2010 | Lee | H01L 27/153 257/89 |
| 2014/0203240 A1 | 7/2014 | Hwang et al. | |
| 2014/0231833 A1* | 8/2014 | Jeong | H01L 27/156 257/88 |
| 2014/0312368 A1* | 10/2014 | Lee | H01L 21/6835 257/89 |
| 2014/0367633 A1 | 12/2014 | Bibl et al. | |
| 2019/0131342 A1* | 5/2019 | Chen | H01L 33/504 |
| 2019/0198561 A1* | 6/2019 | Wildeson | H01L 33/38 |

FOREIGN PATENT DOCUMENTS

| | | |
|---|---|---|
| JP | 2015-219277 A | 12/2015 |
| JP | 2017-037121 A | 2/2017 |
| KR | 10-2010-0055747 A | 5/2010 |
| KR | 10-2014-0093433 A | 7/2014 |
| KR | 10-2016-0010869 A | 1/2016 |

* cited by examiner

LIGHT-EMITTING DIODE CHIP AND MICRO DISPLAY DEVICE

CROSS REFERENCE TO RELATED APPLICATION

This application claims priority from Korean Patent Application No. 10-2017-0172248, filed on Dec. 14, 2017, which is hereby incorporated by reference for all purposes as if fully set forth herein.

BACKGROUND

Technical Field

The present disclosure relates to a light-emitting diode chip and a micro display device.

Description of Related Art

In response to the development of the information society, there has been increasing demand for display devices able to display images. Recently, a range of display devices, such as liquid crystal display (LCD) devices, plasma display devices, and organic light-emitting display devices, have come into widespread use.

Such display devices may include a display panel having a plurality of subpixels and a variety of driver circuits, such as a gate driver circuit, a data driver circuit, and the like, for driving the display panel.

In a display device of the related art, a display panel is constructed by disposing transistors, a variety of electrodes, a variety of signal lines, and the like on a glass substrate. A driver circuit, capable of being provided as an integrated circuit (IC), is mounted on a printed circuit board (PCB) to be electrically connected to the display panel.

However, the structure of the conventional display device is suitable for a large-scale display device, rather than a small-scale display device.

Thus, a display device using a micro light-emitting diode (µLED) (also referred to as a "micro display device") having a structure suitable for a small-scale display device has recently appeared. Here, a micro LED (µLED) means a microscopic LED having a size equal to or less than tens of µm.

The display device using µLEDs can be advantageously used in a variety of applications, such as smartwatches, mobile devices, virtual reality devices, augmented reality devices, and flexible devices, since the size and weight thereof can be reduced due to such µLEDs being used as pixels.

For example, the micro display device may be implemented by growing a µLED on a sapphire substrate, removing the µLED from the sapphire substrate, and transferring the removed µLED to a transistor substrate.

When the µLED is implemented using such a transfer method, there is a problem in that the µLED is very small, so the transfer process may be relatively complicated, being difficult to improve precision and yield of the process.

Further, since for production of light, the transfer process is performed after µLEDs for red (R) light, green (G) light, and blue (B) light, respectively, are grown, the number of transfer steps and process times increase, causing increased defects due to misalignments, which are problematic.

SUMMARY

Accordingly, embodiments of the present disclosure are directed to a light-emitting diode chip and micro display device that substantially obviate one or more of the problems due to limitations and disadvantages of the related art.

An aspect of the present disclosure is provide a micro light-emitting diode (µLED) capable of producing all light of red (R), green (G), and blue (B) with a single µLED chip, and a micro display device having the same.

An aspect of the present disclosure is provide a µLED capable of producing all light of red, green, and blue with improved process efficiency and having a simplified driver circuit for driving the µLED.

Another aspect of the present disclosure is provide a µLED implemented with improved process precision and reduced defects through an improved transfer process.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a light-emitting diode (LED) chip may comprise: a first semiconductor layer; a first active layer disposed on the first semiconductor layer to emit light corresponding to a first wavelength band; a second active layer disposed on the first semiconductor layer separately from the first active layer to emit light corresponding to a second wavelength band, the second active layer comprised of two regions; a second semiconductor layer disposed on the first active layer and the two regions of the second active layer; a phosphor layer disposed on one region of the two regions of the second active layer; a first wall disposed between the first active layer and one region of the two regions of the second active layer; and a second wall disposed between the two regions of the second active layer.

In another aspect of the present disclosure, an LED chip may include: a first semiconductor layer; a plurality of light-emitting units disposed on the first semiconductor layer, and comprising an active layer and a second semiconductor layer; a plurality of walls disposed on the first semiconductor layer to divide the light-emitting units from each other; and a color-conversion layer disposed on at least one light-emitting unit of the light-emitting units.

In another aspect, a micro display device may comprise: a plurality of gate lines; a plurality of data lines intersecting with the gate lines; a plurality of pixels defined by the intersection between the gate lines and the data lines; and a plurality of light-emitting diodes disposed in the pixels, respectively. Each of the light-emitting diodes may include: a first semiconductor layer; a first active layer disposed on the first semiconductor layer to emit light corresponding to a first wavelength band; a second active layer disposed on the first semiconductor layer separately from the first active layer to emit light corresponding to a second wavelength band, the second active layer included of two regions; a second semiconductor layer disposed on the first active layer and the two regions of the second active layer; a phosphor layer disposed on one region of the two regions of the second active layer; a first wall disposed between the first active layer and one region of the two regions of the second active layer; and a second wall disposed between the two regions of the second active layer.

According to exemplary embodiments, all of red (R), green (G), and blue (B) light can be produced using a single µLED by simultaneously producing green light using a blue light-producing wafer, and producing red light using a red phosphor having high absorptivity for blue or green light.

According to exemplary embodiments, the µLED capable of producing all of red, green, and blue light can be easily implemented by regrowing a green light-producing section on a blue light-producing wafer. Further, with the µLED implemented based on blue and green light having a similar driving voltage, the driver circuit can be simplified.

According to exemplary embodiments, all of red, green, and blue light can be produced using a single µLED chip, thereby reducing the number of transfer processes and process time required for the µLED and improving the precision and yield of the process.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated and constitute a part of this application, illustrate embodiments of the disclosure and together with the description serve to explain various principles. In the drawings.

DETAILED DESCRIPTION

Figure 1:
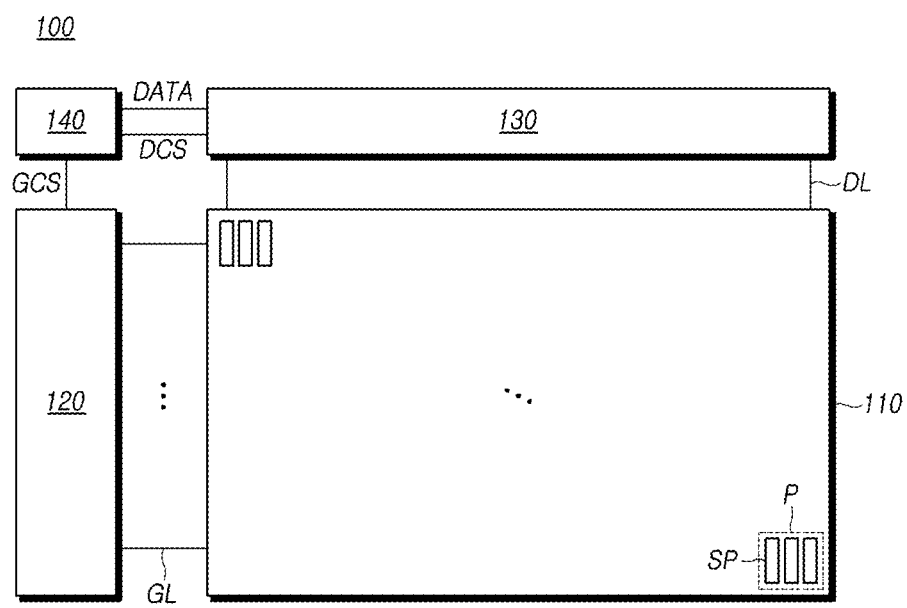
FIG. 1 schematically illustrates a micro display device according to exemplary embodiments.

Hereinafter, reference will be made to embodiments of the present disclosure, examples of which are illustrated in the accompanying drawings. Throughout this document, reference should be made to the drawings, in which the same reference numerals and symbols will be used to designate the same or like components. In the following description of the present disclosure, detailed descriptions of known functions and components incorporated herein will be omitted in the case that the subject matter of the present disclosure may be rendered unclear thereby.

It will also be understood that, while terms such as "first," "second," "A," "B," "(a)," and "(b)" may be used herein to describe various elements, such terms are merely used to distinguish one element from other elements. The substance, sequence, order, or number of these elements is not limited by these terms. It will be understood that when an element is referred to as being "connected to" or "coupled to" another element, not only can it be "directly connected or coupled to" the other element, but it can also be "indirectly connected or coupled to" the other element via an "intervening" element. In the same context, it will be understood that when an element is referred to as being formed "on" or "under" another element, not only can it be directly formed on or under another element, but it can also be indirectly formed on or under another element via an intervening element.

Referring to FIG. 1, a micro display device 100 according to exemplary embodiments may include a display panel 110, in which a plurality subpixels SP, each having a micro light-emitting diode (µLED), are arranged, and a gate driver circuit 120, a data driver circuit 130, a controller 140, and the like for driving the display panel 110.

In the display panel 110, a plurality of gate lines GL and a plurality of data lines DL are disposed, and subpixels SP are arranged in intersections between the gate lines GL and the data lines DL. The subpixels SP may each have the µLED, and two or more subpixels SP may form a single pixel P.

The gate driver circuit 120 is controlled by the controller 140 so as to sequentially output scan signals to the gate lines GL arranged in the display panel 110 to thereby control driving timing of the subpixels SP.

The gate driver circuit 120 may include one or more gate driver integrated circuits (GDICs), and may be located on one or both sides of the display panel 110 according to the driving manner. Otherwise, the gate driver circuit 120 may be located on a rear surface of the display panel 110.

The data driver circuit 130 serves to receive image data from the controller 140 and convert the image data into analog data voltages. Further, the data driver circuit 130 outputs the data voltages to the respective data lines DL, according to the timing at which scan signals are applied via the gate lines GL, so that the respective subpixels SP exhibit brightness according to the image data.

The data driver circuit 130 may include one or more source driver integrated circuits (SDICs).

The controller 140 serves to supply a variety of control signals to the gate driver circuit 120 and the data driver circuit 130 so as to control the operation of the gate driver circuit 120 and the data driver circuit 130.

The controller 140 controls the gate driver circuit 120 to output the scan signal according to the timing occurring in respective frames, and serves to convert the externally received image data into image data suitable for a data signal format used in the data driver circuit 130, and output the converted image data to the data driver circuit 130.

The controller 140 receives from an exterior (e.g. a host system) a variety of timing signals, such as vertical sync signals (Vsync), horizontal sync signals (Hsync), input data enable (DE) signals, clock signals (CLK), and the like, along with the image data.

The controller 140 may generate various control signals using various timing signals received from an exterior, and output the generated signals to the gate driver circuit 120 and the data driver circuit 130.

For example, the controller 140 outputs various gate control signals, such as gate start pulse (GSP), gate shift clock (GSC), gate output enable (GOE), and the like, in order to control the gate driver circuit 120.

Here, the gate start pulse (GSP) controls the start timing to operate one or more gate driver integrated circuits constituting the gate driver circuit 120. The gate shift clock (GSC) is a clock signal commonly input to the one or more gate driver integrated circuits to control shift timing of the scan signal. The gate output enable signal (GOE) designates timing data of the one or more gate driver circuits.

The controller 140 outputs various data control signals, such as source start pulse (SSP), source sampling clock (SSC), source output enable (SOE), and the like, in order to control the data driver circuit 130.

Here, the source start pulse (SSP) controls the start timing of the data sampling of one or more source driver integrated circuits constituting the data driver circuit 130. The source sampling clock (SSC) is a clock signal to control the data sampling timing at respective source driver integrated circuits. The source output enable (SOE) signal controls the output timing of the data driver circuit 130.

The micro display device 100 may further include a power management integrated circuit to supply various voltages or currents to the display panel 110, the gate driver circuit 120, the data driver circuit 130, or the like, or control various voltages or currents to be supplied thereto.

In the display panel 110, in addition to the gate lines GL and the data lines DL, voltage lines via which various signals or voltages are supplied may be arranged. In the respective subpixels SP, the μLED and transistors for driving the same may be arranged.

Figure 2:
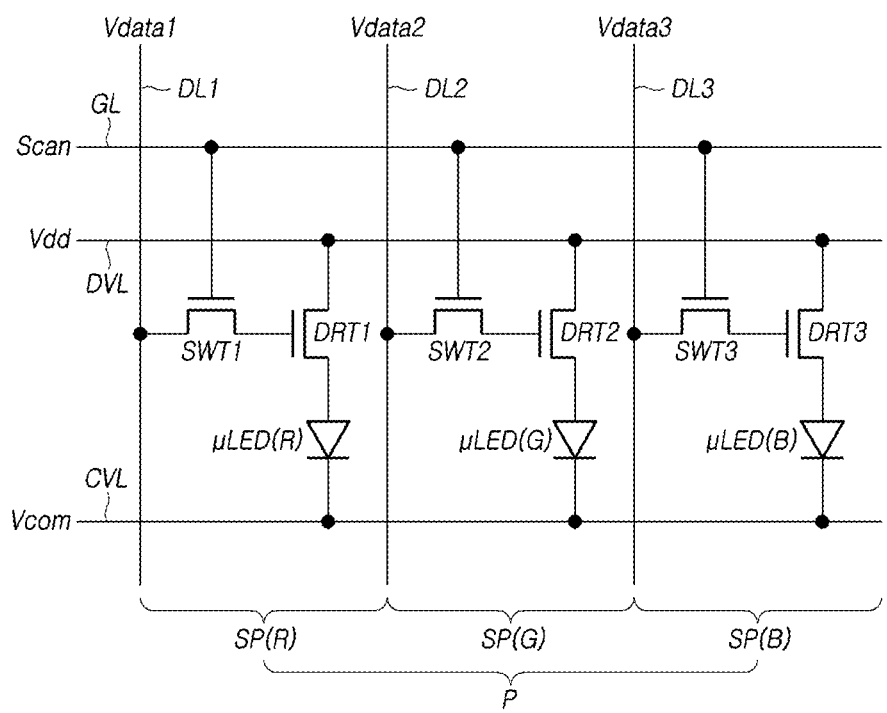
FIG. 2 illustrates an exemplary circuit structure of a pixel arranged in a display panel of the micro display device 100 according to exemplary embodiments.

FIG. 2 illustrates an exemplary circuit structure of the subpixel SP in the micro display device 100 according to embodiments, illustrating the case in which three subpixels SP form a single pixel P.

Referring to FIG. 2, in the display panel 110, along with the gate line GL via which the scan signal is applied and the data lines DL via which data voltages Vdata are applied, a driving voltage line DVL via which a driving voltage Vdd is applied, a common voltage line CVL via which common voltage Vcom is applied, and the like may be arranged.

Further, subpixels SP producing red (R) light, green (G) light, and blue (B) light, respectively, are arranged at intersections between the gate line GL and the data lines DL.

To respective subpixels SP, the μLED and one or more transistors, capacitors, etc. for driving the μLED may be arranged.

For example, in a red subpixel SP(R) at an intersection between the first data line DL1 and the gate line GL, a μLED(R) emitting red light, a first driving transistor DRT1 driving the μLED(R), and a first switching transistor SWT1 controlling the operation timing of the first driving transistor DRT1 may be arranged.

Here, the first driving transistor DRT1 may be connected to an anode electrode of the μLED(R) as illustrated in FIG. 2, but may be connected to a cathode electrode of the μLED(R).

Further, a storage capacitor may be arranged between a gate electrode and a source electrode (or a drain electrode) of the first driving transistor SRT1 to maintain a data voltage Vdata during a single video frame.

When the scan signal is applied via the gate line GL, the first switching transistor SWT1 is turned on, and the first data voltage Vdata1 is applied to the gate electrode of the first driving transistor DRT1. Then, the driving voltage Vdd is applied to an anode electrode of the μLED, and the common voltage Vcom is applied to a cathode electrode of the μLED. Thus, the μLED emits light having a level of brightness according to a difference in voltages applied to the anode electrode and the cathode electrode.

The μLED(G) and μLED(B) arranged in the green subpixel SP(G) and the blue subpixel SP(B) operate similarly, so that the subpixels SP(G), SP(B) may emit green and blue light, respectively.

The μLEDs arranged in the red, green, blue subpixels SP(R), SP(G), SP(B) may be provided through being grown on separate wafer substrates and transferred to the display panel 110.

Figure 3:
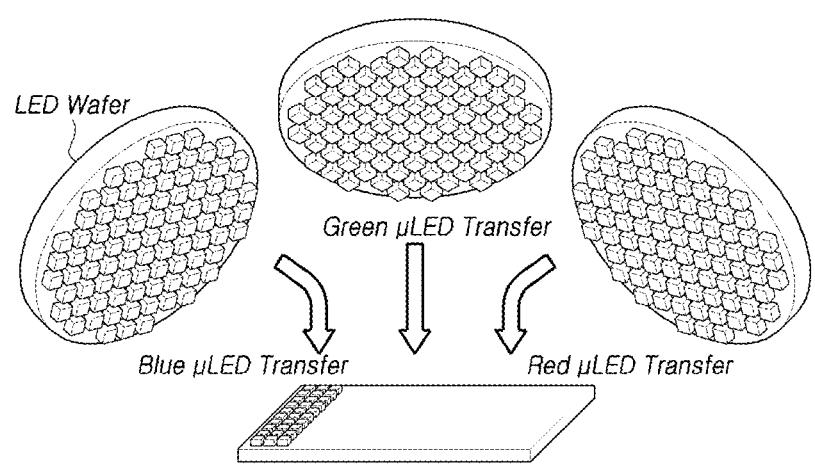
FIG. 3 illustrates an exemplary transfer process of a µLED according to exemplary embodiments.

FIG. 3 illustrates an exemplary transfer process of the μLEDs to the display panel 110 in the micro display device 100 according to embodiments.

Referring to FIG. 3, blue, green, and red (BGR) micro light-emitting diodes μLED(B), μLED(G), μLED(R) are grown on separate wafers using an epitaxial process.

Here, the blue μLED(B) and the green μLED(G) may be grown using a GaN based epitaxial process, while the red μLED(R) may be grown using a GaAs based epitaxial process. Further, during the epitaxial process, the blue μLED(B) and the green μLED(G) may be grown using a different amount of epitaxial materials.

Thus, μLED(B), μLED(G), and μLED(R) exhibiting the blue, green, and red light, respectively, are grown separately on different wafer substrates, and are then transferred to the display panel 110.

In this manner, since the μLEDs constituting respective subpixels SP are arranged in the display panel 110 through the transfer process, the number of transfer processes and process times may greatly increase. Further, since the μLEDs exhibiting respective light have different electrical properties, the driving technique may become complicated.

Exemplary embodiments provide a micro light-emitting diode (μLED) capable of producing all light of red, green, and blue so as to improve the transfer process, thereby simultaneously improving driving efficiency.

Figure 4:
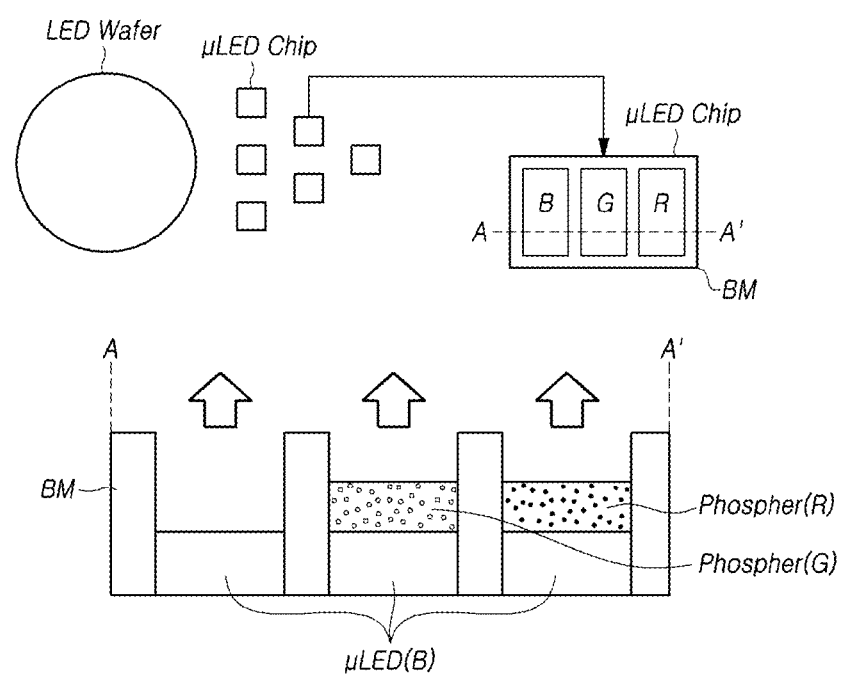
FIG. 4 illustrates an exemplary structure of the µLED chip implemented based on blue according to exemplary embodiments.

FIG. 4 illustrates an exemplary structure of a micro light-emitting diode (μLED) according to exemplary embodiments, wherein the μLED produces the red, green, and blue light based on blue light.

Referring to FIG. 4, the micro light-emitting diode (μLED) can be grown on a wafer substrate based on the blue epitaxy. Then, the single μLED chip grown based on the blue epitaxy is divided into three regions.

The three regions of the μLED chip may be divided by walls, and such walls may be made of, but is not limited to, a black matrix BM.

One of the three regions of the μLED chip divided by the black matrices BM is used to produce blue light. A green phosphor is disposed on the blue μLED(B) in one of the two remaining regions, and a red phosphor is arranged in the other of the two remaining region.

When the blue μLED(B) emits blue light, the green phosphor (G) and the red phosphor (R) can absorb the blue light and emit green and red light.

Further, a green color filter and a red color filter may be disposed on the blue μLED(B) so as to produce green and red light.

Further, quantum dots or organic nano materials may be disposed on the blue μLED(B) so as to produce the green, red light.

Since the single μLED chip is divided into three regions by the black matrices BM, and the three regions produce different light, the single μLED can produce all light of red, green, and blue.

This is accomplished based on the single blue μLED(B), thereby having an advantage in that there is no need to grow three μLEDs in order to produce blue light.

Thus, the number of processes to transfer the μLED from the wafer substrate to the display panel 110 can be reduced to ⅓. Further, since the chip may be designed to have a relatively large size, the difficulty in transferring due to microscopic chip can be mitigated. Thus, precision and yield of the transfer process are improved, and process defects are reduced.

Further, since the red, green, and blue light can be produced using the same μLED producing blue light, a driving voltage range of the μLED is the same, thereby enabling the driver circuit to be simplified.

Figure 5:
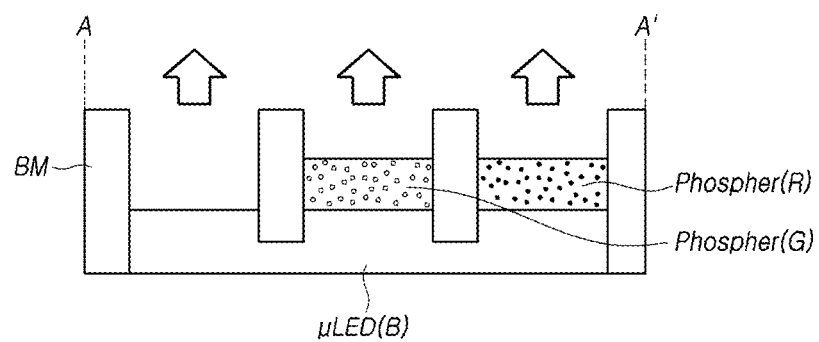
FIG. 5 illustrates another exemplary structure of the µLED chip implemented based on blue according to exemplary embodiments.

FIG. 5 illustrates another exemplary structure of the μLED chip of FIG. 4.

Referring to FIG. 5, the single μLED chip may be divided into three regions by black matrices BM.

Here, in the three regions, one region produces blue light, another region is provided with a green phosphor to produce green light, and a further region is provided with a red phosphor to produce red light.

Here, the μLED may have a stacked structure of a n-type semiconductor layer, an active layer, and a p-type semiconductor layer. The n-type semiconductor layer may be connected to a n-type electrode, the p-type semiconductor layer may be connected to a p-type electrode, and the active layer can emit light according to a voltage applied to the n-type and p-type electrodes so that the μLED produces the light.

Here, since the same blue μLED is disposed in the three regions of the μLED chip, an n-type semiconductor layer may be connected throughout the three regions.

That is, the n-type semiconductor layer may be disposed throughout the red, green, and blue light regions, and the p-type semiconductor layer and the active layer on the n-type semiconductor layer can be disposed separately from respective regions.

Thus, the black matrices BM disposed in the μLED chip to divide it into three regions may be disposed separately from a lower surface of the μLED chip. That is, the black matrices BM may be disposed on the n-type semiconductor layer so as to prevent mixing of the light of adjacent regions.

Since the n-type semiconductor layer is disposed throughout the three regions, there is no need to respectively dispose n-type electrodes in the three regions, and thus a voltage can be applied to the μLED through a single n-type electrode.

In this manner, according to exemplary embodiments, the single μLED chip can produce three colors of light, thereby having an advantage with respect to the transfer process and driving efficiency. Further, according to exemplary embodiments, since the single μLED chip can produce three colors of light using the blue and green based μLEDs, the μLED can have advantages with respect to excellent light-expression performance and driving efficiency.

Figure 6:
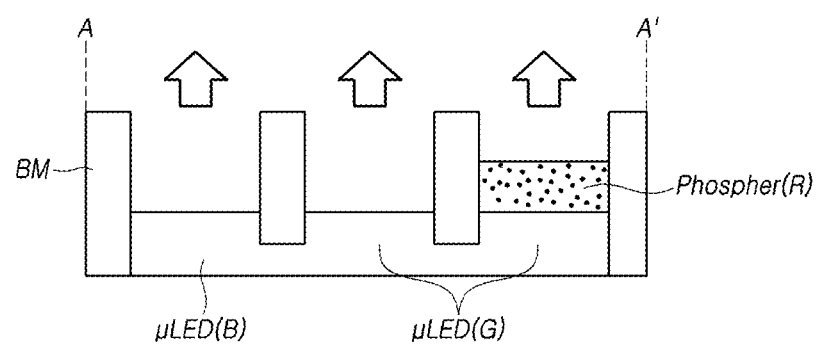
FIG. 6 illustrates an exemplary structure of the µLED chip implemented based on blue and green according to exemplary embodiments.

FIG. 6 illustrates an exemplary structure of the μLED chip according to exemplary embodiments, illustrating the blue and green based μLEDs.

Referring to FIG. 6, the μLED chip may be divided into three regions by black matrices BM.

In the tree regions of the μLED chip, one region may have a μLED producing blue light, and two remaining regions may have a μLED producing green light.

One of the two remaining regions, in which the μLED producing green light is disposed, may have a red phosphor or color filter disposed therein.

Thus, the region having the blue μLED produces blue light. Further, in the regions having the green μLED, the region having the red phosphor therein produces red light, and the other region produces green light.

Since blue and green light can be produced using the μLED consisting of active layers producing blue and green light, light-representation performance can be improved.

Further, since the blue μLED and the green μLED have a similar driving voltage range (e.g. about 3.0 V), the complexity of the driving technique is reduced.

The blue and green based μLEDs may be implemented by growing a blue based μLED and regrowing a green based μLED.

FIGS. 7A to 7H illustrate exemplary processes of growing the blue and green based μLEDs according to exemplary embodiments.

Figure 7A:
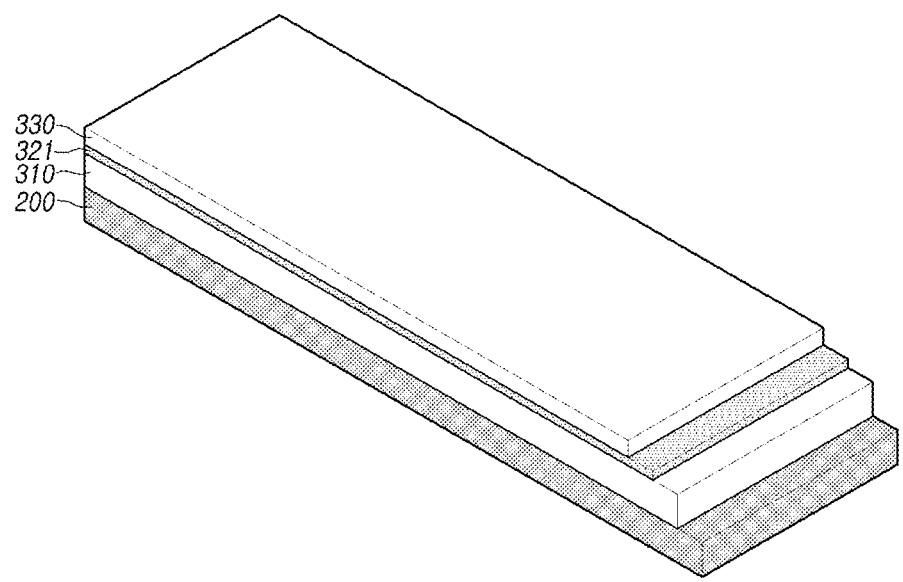
FIGS. 7A to 7H illustrate exemplary processes of forming the µLED of FIG. 6.

Referring to FIG. 7A, the blue and green based μLED may be fabricated on a wafer substrate on which the blue μLED is grown.

In an example, a first semiconductor layer 310 is disposed on a sapphire substrate 200, and a first active layer 321, which emits blue light when applied with a voltage, is grown on the first semiconductor layer 310. Then, a second semiconductor layer 330 is disposed on the first active layer 321.

Here, the first semiconductor layer 310 may be an n-type semiconductor layer such as an n-type GaN based semiconductor layer. In addition, the first active layer 310 may be a multi quantum well, and the second semiconductor layer 330 may be a p-type semiconductor layer, such as a p-type GaN based semiconductor layer.

When the blue μLED is completely grown, a process of regrowing the green μLED on a portion of the blue μLED is performed.

Figure 7B:
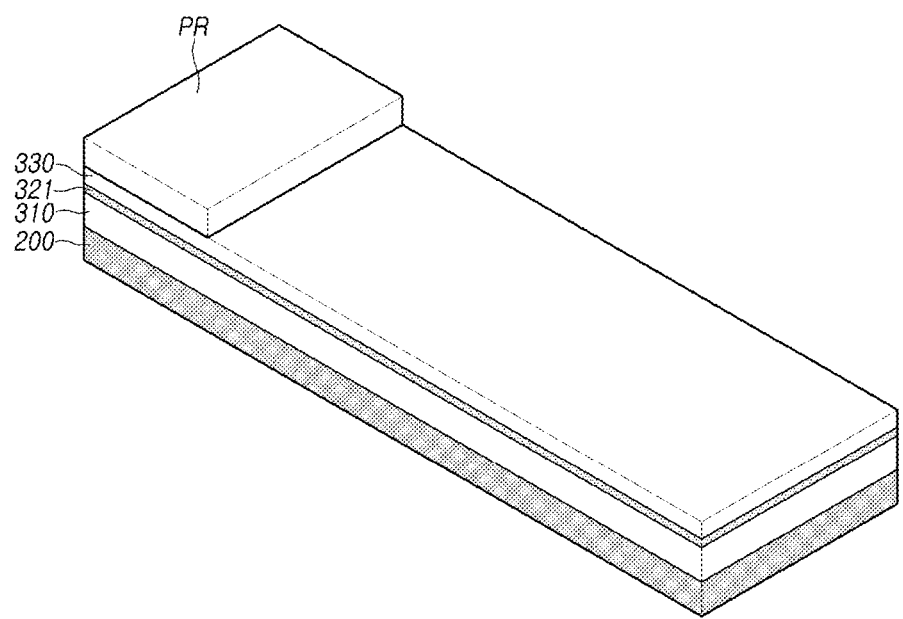

Referring to FIG. 7B, a photoresist PR is applied to the region producing blue light on the blue μLED.

Figure 7C:
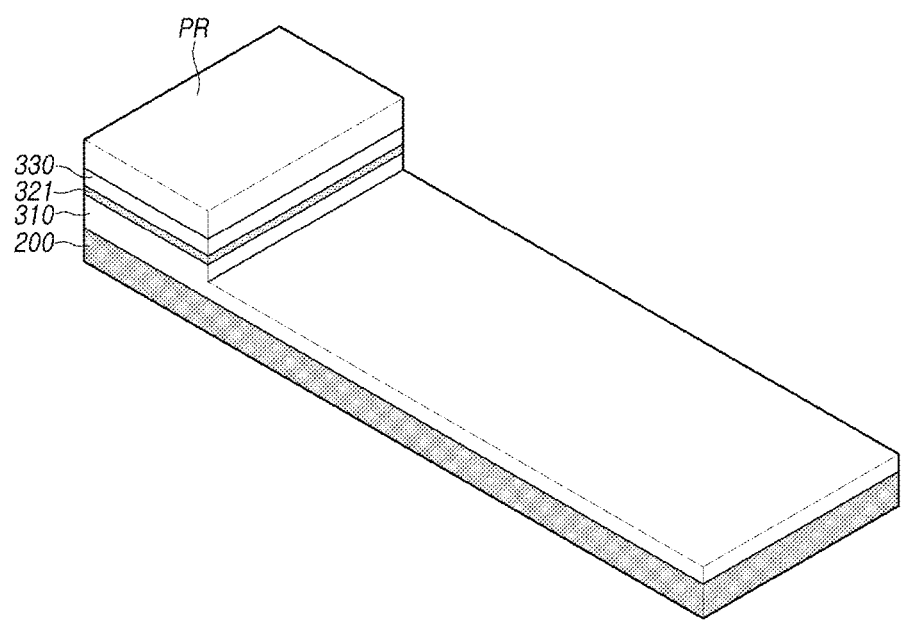

Referring to FIG. 7C, when the photoresist PR has been applied to the blue μLED, an etching process is performed. The etching process may be performed to etch a portion of the first semiconductor layer 310 such that the first active layer 321 is exposed from the etched portion of the first semiconductor layer.

That is, the photoresist PR is in a region other than the region for regrowing the green μLED and the region for forming the black matrix BM, and then the etching process is performed so as to form the region for producing blue light.

Here, when the portion of the first semiconductor layer 310 is etched to expose a side of the first active layer 321, the blue light emitted from the first active layer can be blocked by the black matrix BM, which will be disposed later.

Figure 7D:
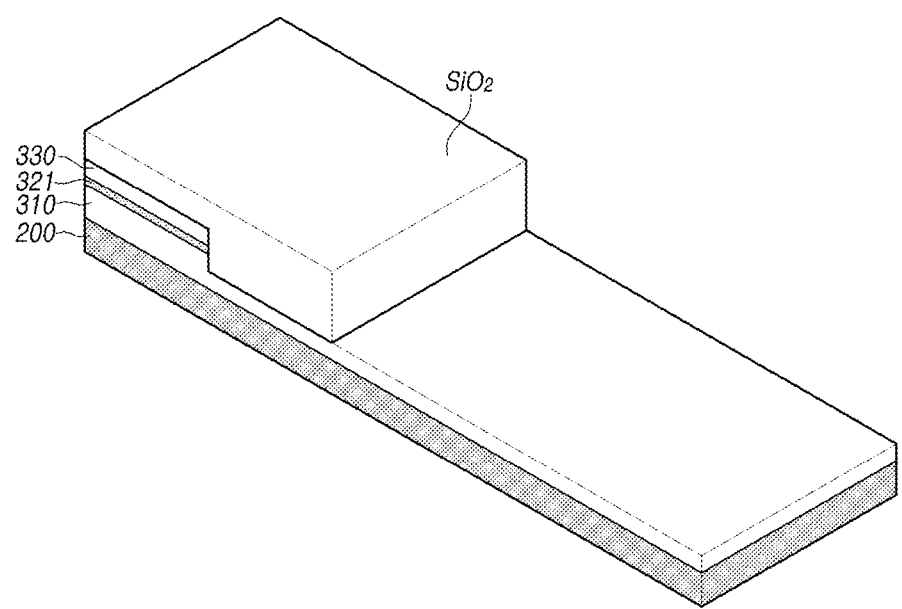

Referring to FIG. 7D, after the etching process, an insulating layer is disposed on the region producing the blue light and the adjacent region in which the black matrix BM is disposed. The insulating layer may be a $SiO_2$ layer.

Here, the region other than the region in which the insulating layer is disposed is a region for regrowing the green μLED, so that the insulating layer disposed on the blue μLED protects the blue μLED from the regrowth process of the green μLED.

Figure 7E:
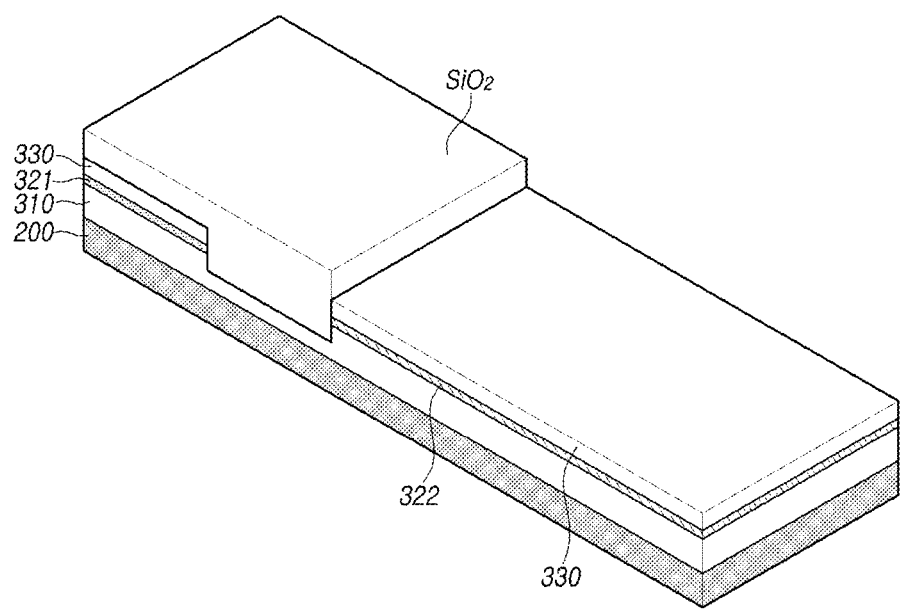

Referring to FIG. 7E, the regrowth process of the green μLED is performed on the region in which the insulating layer is not disposed.

In the region in which the insulating layer is not disposed, when a voltage is applied to the first semiconductor layer 310, a second active layer 322 emitting green light is grown. Then, a second semiconductor layer 330 is disposed on the second active layer 322.

Through this procedure, the blue µLED and the green µLED can be implemented as a single chip.

When the regrowing of the green µLED is completed, a process of dividing the green µLED into two sub-regions is performed in order to allow the green µLED to be used to separately produce green and red light.

Figure 7F:
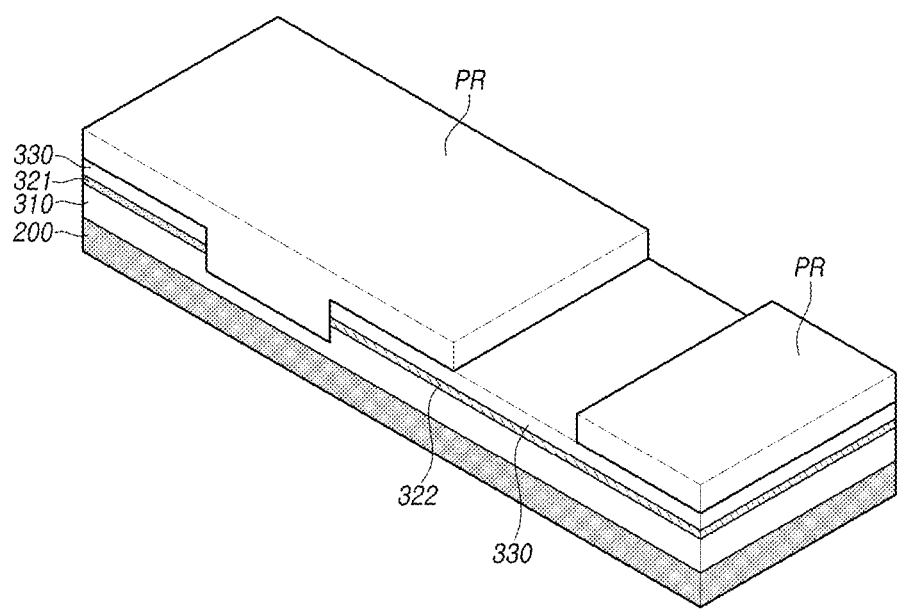

Referring to FIG. 7F, a photoresist PR is applied to the blue µLED and the green µLED. Here, the photoresist PR is not applied to the region in which the black matrix BM is to be disposed to divide the green µLED into two sub-regions.

Figure 7G:
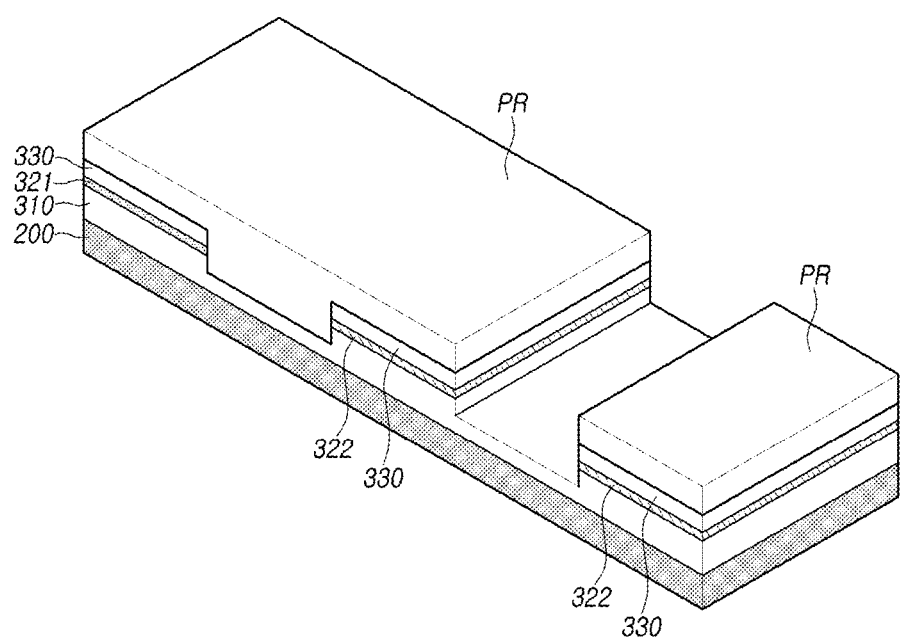

Referring to FIG. 7G, after the photoresist PR is applied, an etching process is performed.

The etching process is performed to etch a portion of the first semiconductor layer 310 so that the second active layer 322 is exposed from the etched portion.

Figure 7H:
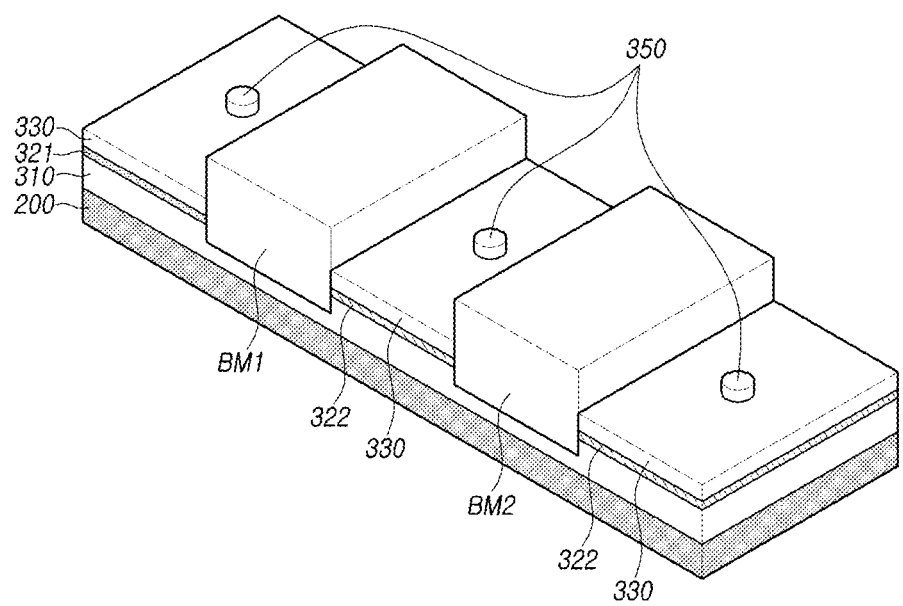

Referring to FIG. 7H, after the etching process, the photoresist PR is removed, and the black matrix BM is disposed.

A first black matrix BM1 is disposed between the blue µLED and the green µLED so as to prevent the mixing of the blue light and the green light. In addition, a second black matrix BM2 is disposed on an intermediate portion of the green µLED to divide the green µLED into two sub-regions such that one sub-region can be used to produce green light and the other sub-region can be used to produce red light.

A second electrode 350 is formed on the second semiconductor layer 330 disposed throughout the three regions. The second electrode 350 may be a p-type electrode. Although not shown in FIG. 7H, a first electrode 340 is formed so as to be connected to the first semiconductor layer 310. The first electrode 340 may be an n-type electrode. The first electrode may be disposed on a side surface or a bottom surface, or otherwise may be disposed on a top surface of the first semiconductor layer 310 protruding from the second semiconductor layer 330, if needed.

When the electrodes have been formed, a red phosphor is coated on one sub-region of the green µLED, thereby forming a µLED chip capable of producing all light of red, green, and blue.

Here, a color filter may be additionally disposed on the region in which the red phosphor is coated in order to cut off leaking green light.

Thus, blue light and green light can be produced by the µLEDs producing the corresponding light, and red light can be produced by a combination of the green µLED, the red phosphor, and the green light cut-off color filter, so that red, green, and blue light can be produced using a single µLED chip. This can provide high light-representation performance.

Figure 8:
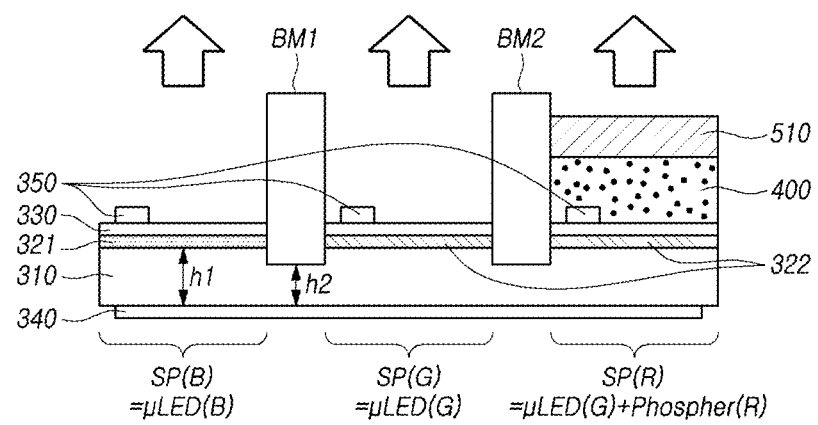
FIG. 8 specifically illustrates an exemplary structure of the µLED chip implemented based on blue and green according to exemplary embodiments.

FIG. 8 illustrates an exemplary structure of a µLED chip formed by the processes of FIGS. 7A to 7H.

Referring to FIG. 8, the first active layer 321 emitting the light of a first wavelength band is disposed on the first semiconductor layer 310. Further, a second active layer 322, comprised of two regions and emitting the light of a second wavelength band, is disposed on the first semiconductor layer 310 separately from the first active layer 321.

Here, the first wavelength band may be a wavelength band corresponding to blue light, and the second wavelength band may be a wavelength band corresponding to green light.

The second semiconductor layer 330 is disposed on the first active layer 321 and the two regions of the second active layer 322, respectively, and the second electrodes 350 are disposed on regions of the second semiconductor layer 330, respectively.

The first electrode 340 may be connected to the first semiconductor layer 310. For example, the first electrode 340 may be disposed on a bottom surface of the first semiconductor layer 310. Here, since the first semiconductor layer 310 extends continuously underneath the first active layer 321 and the two regions of the second active layer 322, the first electrode 340 may be disposed uniformly on the bottom surface of the first semiconductor layer.

A phosphor layer 400 is disposed on one of the two regions of the second active layer 322. The phosphor layer 400 can absorb the light of the second wavelength band, and emit the light of a third wavelength band. Here, the third wavelength band may be a wavelength band corresponding to red light.

A color filter 510 may be disposed on the phosphor layer 400 to transmit light corresponding to a wavelength band excluding the second wavelength band. That is, the color filter 510 cuts off the light corresponding to the second wavelength band and transmits the light corresponding to the other wavelength band. Thus, the color filter can block a portion of the light emitted by the regions of the second active layer 322, the portion which is not absorbed by the phosphor layer 400, thereby improving the efficiency of light emitted from the phosphor layer 400.

The first black matrix BM1 may be disposed between the first active layer 321 and the second active layer 322, and the second black matrix BM2 may be disposed on the intermediate portion of the second active layer 322. Further, a black matrix BM may be additionally disposed so as to surround the circumference of the µLED.

Here, a height h1 of the first semiconductor layer 310 disposed on the bottom surface of the first active layer 321 may be higher than a height h2 of the first semiconductor layer 310 disposed on the bottom surface of the first black matrix BM1. That is, the first black matrix BM1 is positioned below the first active layer 321 and the second active layer 322 so as to block light emitted by the first and second active layers.

Further, the highest point of the second black matrix BM2 may be level with or higher than the color filter 510. Thus, the second black matrix BM2 can prevent the mixing of light emitted from opposite regions thereof.

Such a µLED chip can produce all light of red, green, and blue, and respective regions divided by the first and second black matrices BM1, BM2 can constitute a single subpixel SP in the micro display device 100.

Thus, compared to the configuration in which the red, green, and blue µLEDs are separately grown, and then are transferred to the display panel 110, the present configuration in which the single µLED chip forms a single pixel P having three subpixels SP can reduce the number of the transfer processes.

The first electrode 340 connected to the first semiconductor layer 310 is commonly used with a single pixel P, and the second electrode 350 connected to the second semiconductor layer 330 is only implemented as an individual electrode, thereby making the configuration of electrodes easier.

Further, by using not the red µLED having a driving voltage of about 1.9 V, but the blue and green µLEDs having the driving voltage of about 3.0 V, the voltage range for driving the µLED disposed at a single pixel P can be reduced, thereby simplifying the driver circuit.

In the meantime, the µLED chip may be composed of not only blue, green, and green µLEDs, but also blue, blue, and green µLEDs.

This may be accomplished according to characteristics of phosphor materials forming the phosphor layer 400 coated for producing red light.

Figure 9:
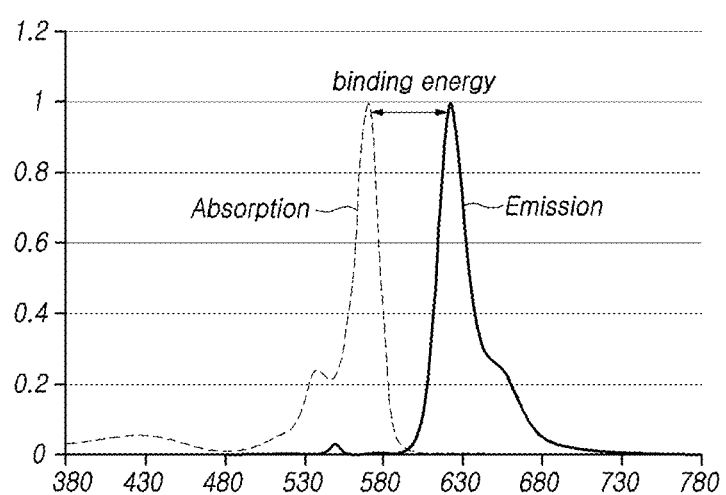
FIG. 9 illustrates exemplary light-absorption and light-emitting wavelength bands of a red phosphor included in the µLED of FIG. 8.

For example, FIG. 9 illustrates absorption and emission characteristics of the phosphor materials forming the phosphor layer 400 employed to the μLED of FIG. 8.

Referring to FIG. 9, the phosphor material employed to the μLED of FIG. 8 is characterized by high absorption of light in a wavelength band corresponding to green light, and emission of light in a wavelength band corresponding to red light.

In some cases, such phosphor materials may also have light absorption in a wavelength band corresponding to blue light and light emission in a wavelength corresponding to red light.

Figure 10:
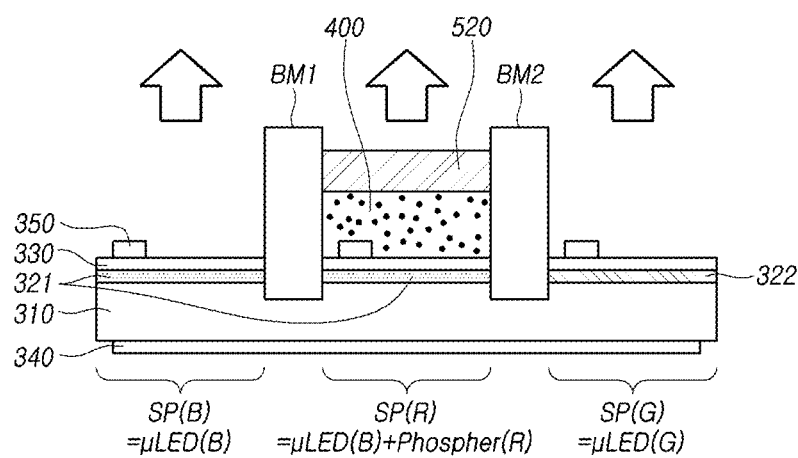
FIG. 10 specifically illustrates an exemplary structure of the µLED chip implemented based on blue and green according to exemplary embodiments.

FIG. 10 illustrates another exemplary structure of a blue and green based μLED chip, wherein the μLED chip is implemented using the blue, blue, and green μLEDs.

Referring to FIG. 10, two first active layers 322 emitting light in a first wavelength band are separately disposed on a first semiconductor layer 310, and a second active layer 322 is disposed separately from the first active layers 321.

Then, portions of a second semiconductor layer 330 are disposed on the first and second active layers 321 and 322, and second electrodes 350 are respectively disposed on the portions of the second semiconductor layer 330. Further, a first electrode 340 may be disposed on a bottom surface of the first semiconductor layer 310.

On one of the two first active layers 321, a phosphor layer 400 absorbing light of a first wavelength band and emitting light of a third wavelength band may be disposed. Further, a color filter 520 may be disposed on the phosphor layer 400 to cut off the light of the first wavelength band.

That is, the blue B), green light can be respectively produced by the first active layer 321 emitting the light in the first wavelength band and the second active layer 322 emitting light in the second wavelength band.

Further, red light can be produced by the first active layer emitting the light in the first wavelength band, and the phosphor layer 400 composed of phosphor material having high absorption of light in the first wavelength band and emission of light in the third wavelength band.

Thus, according to exemplary embodiments, the blue and green μLEDs are implemented by regrowing the green μLED on the blue based μLED. Then, red light is produced by using the blue or green μLED and the phosphor material emitting red light and absorbing blue or green light.

According to exemplary embodiments, since red, green, and blue light can be produced from three regions of a single μLED chip such that the single μLED chip can provide three subpixels SP, the transfer process of the μLED can be facilitated.

In addition, the blue and green μLEDs are implemented through the regrowing of the green μLED on the blue based μLED, and the red μLED is implemented using the red phosphor. Accordingly, the light-representation performance can be improved and three colors of light can be produced by the single chip.

Further, the μLED chip capable of producing three colors of light using the blue and green based μLEDs, which have a driving voltage range similar to that of an epitaxial material, is implemented, thereby facilitating the fabrication of the μLED chip and the configuration of the driver circuit.

It will be apparent to those skilled in the art that various modifications and variations can be made in the light-emitting diode and micro display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A light-emitting diode chip, comprising:
    a first semiconductor layer;
    a first active layer disposed on the first semiconductor layer to emit light corresponding to a first wavelength band;
    a second active layer disposed on the first semiconductor layer separately from the first active layer to emit light corresponding to a second wavelength band, the second active layer comprised of two regions;
    a second semiconductor layer disposed on the first active layer and the two regions of the second active layer;
    a phosphor layer disposed on one region of the two regions of the second active layer;
    a first wall disposed between the first active layer and one region of the two regions of the second active layer; and
    a second wall disposed between the two regions of the second active layer,
    wherein the at least one wall of the first and second walls is disposed to separate at least a portion of the first semiconductor layer.

2. The light-emitting diode chip according to claim 1, wherein the phosphor layer absorbs a portion of light corresponding to the second wavelength band, and emits light corresponding to a third wavelength band.

3. The light-emitting diode chip according to claim 1, further comprising a color filter disposed on the phosphor layer to transmit light corresponding to a wavelength band other than the second wavelength band.

4. The light-emitting diode chip according to claim 3, wherein highest points of the first and second walls are level with or higher than the color filter.

5. The light-emitting diode chip according to claim 1, further comprising:
    a first electrode connected to the first semiconductor layer; and
    a plurality of second electrodes connected to the second semiconductor layer.

6. A micro display device, comprising:
    a plurality of gate lines;
    a plurality of data lines intersecting with the gate lines;
    a plurality of pixels defined by the intersection between the gate lines and the data lines; and
    a plurality of light-emitting diodes disposed in the pixels, respectively, each of the light-emitting diodes comprising:
    a first semiconductor layer;
    a first active layer disposed on the first semiconductor layer to emit light corresponding to a first wavelength band;
    a second active layer disposed on the first semiconductor layer separately from the first active layer to emit light corresponding to a second wavelength band, the second active layer comprised of two regions;
    a second semiconductor layer disposed on the first active layer and the two regions of the second active layer;
    a phosphor layer disposed on one region of the two regions of the second active layer;
    a first wall disposed between the first active layer and one region of the two regions of the second active layer; and
    a second wall disposed between the two regions of the second active layer.

7. The micro display device according to claim 6, wherein a portion of the first semiconductor layer, located below the first active layer, has a first height, and a portion of the first semiconductor layer, located below the first wall, has a second height, the first height being higher than the second height.

8. The micro display device according to claim 6, wherein the phosphor layer absorbs a portion of light within the second wavelength band and emits light within a third wavelength band,
the micro display device further comprising a color filter disposed on the phosphor layer to transmit light corresponding to a wavelength band other than the second wavelength band.

9. The micro display device according to claim 6, wherein each of regions, in which the first active layer and the two regions of the second active layer are disposed, forms a single subpixel.

10. The micro display device according to claim 9, wherein the light-emitting diode further comprises:
a common electrode connected to the first semiconductor layer; and
two or more individual electrodes disposed in the subpixels, respectively, and connected to the second semiconductor layer.

\* \* \* \* \*